United States Patent [19]

Ferralli et al.

[11] 4,421,200

[45] Dec. 20, 1983

[54] ELLIPTICALLY SHAPED TRANSDUCER ENCLOSURE

[76] Inventors: Michael W. Ferralli, 4055 W. 30th St., Erie, Pa. 16506; David R. Moulton, 556 Temple Rd., Dunkirk, N.Y. 14048

[21] Appl. No.: 331,179

[22] Filed: Dec. 16, 1981

[51] Int. Cl.³ .............................................. H05K 5/00

[52] U.S. Cl. .................................... 181/144; 181/155; 181/156; 181/199; 181/175

[58] Field of Search ............... 181/144, 148, 155, 156, 181/175, 191, 289, 30, 199; 179/146 R, 1 MF

[56] References Cited

U.S. PATENT DOCUMENTS

| | | | |
|---|---|---|---|
| 1,619,981 | 3/1927 | Knut | 179/146 R |
| 1,716,199 | 6/1929 | Von Hofe et al. | 181/175 |
| 1,786,279 | 12/1930 | Wolff | 181/155 |
| 2,643,727 | 6/1953 | Leon | 181/155 |
| 2,732,907 | 1/1956 | Leon | 181/175 |

FOREIGN PATENT DOCUMENTS

| | | | |
|---|---|---|---|
| 2366767 | 6/1978 | France | 181/156 |

*Primary Examiner*—Benjamin R. Fuller

[57] ABSTRACT

An enclosure for transducers incorporates an interior acoustically reflective shell. This acoustically reflective shell is shaped so that the inner surface thereof is the envelope of at least a section of a cylinder of elliptical cross section, an ellipsoid of revolution, or the envelope of a multitude of said shapes oriented so that the elliptical shapes share one common focus and each has one distinct focus. In this last case, transducers are placed at the distinct foci so that sound produced by them is directed substantially toward that portion of the elliptical acoustically reflective shell to which the distinct foci belong. In operation sound generated by the transducers, operating in phase with one another, is focused and concentrated at the common focus such that this common focus acts as a singular source of phase coherent sound of any desired angular beamwidth and intensity. If the acoustically reflective shell consists of a section of a single elliptical shape, a transducer is placed at one focus oriented so that either front or rear generated sound is directed substantially toward the elliptical shape, reflected and focused at the other focal point. Sound emanating from this second focal point may be phase coherent, and have angular beamwidth and intensity as desired.

7 Claims, 3 Drawing Figures

ELLIPTICALLY SHAPED TRANSDUCER ENCLOSURE

FIELD OF INVENTION

This invention relates to acoustic enclosures and specifically to an improved acoustic enclosure for loudspeakers or other acoustic transducers.

DISCUSSION OF PRIOR ART

Heretofore, acoustic enclosures were designed to either absorb back-reflected sound or reflect it forward by use of an enclosure containing a multitude of flat or otherwise shaped baffles. Almost universally such reflective baffle designs ignore the fact that back directed sounds, when reflected forward, are not matched in phase with those sounds issuing from the transducer front surface. The result of this mismatch of phase is coloration of the sound and a loss in fidelity. Further, such designs are subject to extensive enclosure resonance wherein, at specific frequencies, the enclosure sympathetically resonates with the transducer contained within. This results in increased loudness at those specific frequencies and again sound coloration and decreased fidelity.

Those enclosures which act to absorb back reflected sound also have inherent resonances, although owing to the incorporation of absorption material in their design, they are less predominant. Absorber type enclosures, therefore, also tend to color sound. Further, absorber type enclosures, since they dissipate most back reflected sound as heat, tend to lack efficiency.

Still other acoustic enclosures exist which act to increase total radiated sound by incorporating a number of transducers in an enclosure. These transducers may or may not operate in phase with each other, but act to produce a so-called wall of sound. However, the transducers in this case must be spatially separated from each other and thus, there will exist points in the sound field they produce which, in specific frequencies, interfere and distort the sound. This phenomenon is a direct consequence of the fact that the distance from any spatial point in the sound field produced by the transducer array to any specific transducer is different for each transducer. Such multi-transducer enclosures thus lack fidelity.

Some enclosures in the prior art utilize geometrically shaped enclosures or enclosure cavities to focus and concentrate sound produced by the transducer. All such designs in the prior art are inherently deficient in design in that they do not allow for the fact that a geometrical shape will act to focus sound only if the dimensions of that shape are larger than the wavelength of the sound produced. Thus, if sounds of wavelengths larger than the enclosure cavity dimensions are not filtered from the transducer, these sounds will not be focused. The higher frequency short wavelength sounds will be focused and seem to have as their origin this focal point rather than the transducer itself. The source of the low frequency long wavelength sound will, on the other hand, have as a source the transducer itself. The result is that the high frequency components of the reproduced sound will be spatially removed from the low frequency components, and if the separation is large, the result will be an unfaithful reproduction of sound and a loss in intelligibility. Further, it is noted that such designs as appear in the prior art do not focus all high frequency sound produced by the transducer. Non-focused high frequency sound will seem to have as the source the actual transducer while the focused high frequency sound will seem to have as the source the point of focus. The high frequency sound will thus appear to have two distinct sources causing a distortion of fidelity and loss of intelligibility. Also in such designs, non-focused sound may reach the focal point directly via a path of different length than the sound which is focused, resulting in interference due to phase mismatch. The effect of this design defect will be coloration of the sound which appears to originate from the focal point.

The prior art also includes use of an array of separate geometrically shaped enclosures so aligned as to have a common focal point. An array of such transducers will not significantly improve the sound quality over that produced by an array of transducers in any non-focusing enclosure or set of enclosures since no provision is made for the sound to arrive at the common focal point in phase. This is a consequence of the fact that the sound arriving at this common point from different transducers does so by traversing different pathlengths. Sound produced by different transducers operating in phase with each other will arrive at the common focal point in phase only if all paths so traversed are the same length.

Also, those transducers in the prior art using geometrically shaped focusing-type enclosures do not allow for the fact that the sound angular beamwidth from the focal point of the enclosures can be smaller than the angular beamwidth from the transducer itself. High frequency transducers are inherently plagued by the fact that high frequency sound tends to be highly directional or beamwidth limited. Further limiting angular beamwidth is a definite disadvantage in such designs.

OBJECTS

Accordingly, an object of our invention is to provide an enclosure which will focus all sound emanating from a transducer to a specific focal point, said sound arriving at that focal point in phase so that all the sound will seem to have a singular source. Another object of our invention is to limit the frequency of sound produced by the transducer to those which the enclosure can effectively focus. Another object of our invention is to increase both the angular beamwidth and intensity of sound by use of an enclosure shaped as the envelope of focusing geometrical shapes, specifically the envelope of the elliptical geometrical shape.

Still another object of our invention is to provide an enclosure which will increase the efficiency and fidelity of a transducer or array of transducers by eliminating the potential of such a transducer or transducer array to interfere with either itself or another transducer in the array. It is another object of our invention to provide a single enclosure containing an array consisting of a number of transducers which will appear to act as a singular source with wide angular beamwidth and power or intensity at least equal to that of the sum of all said transducers in the array appearing to act from the same point with the same phase.

It is another object of our invention to provide an enclosure which will create a line of focused sound with small angular beamwidth.

DRAWINGS

DESCRIPTION

Figure 1:
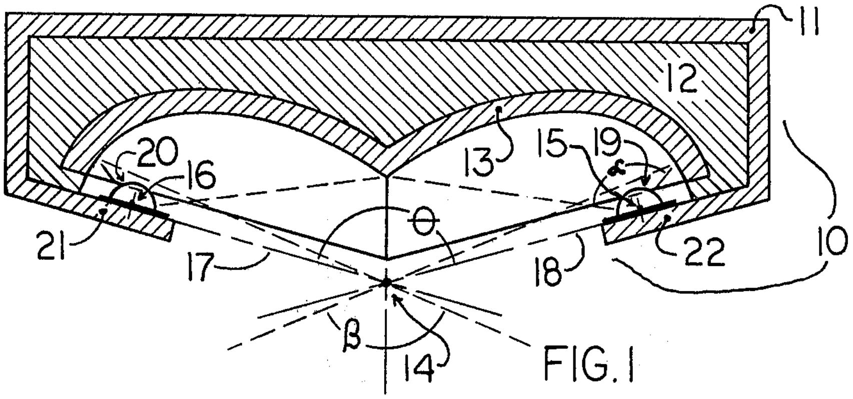
FIG. 1 is a full section as viewed from the top of one embodiment of the invention utilizing as an enclosure, a cavity whose shape is the envelope of two ellipsoids of revolution, such envelope formed so that the ellipsoids have one common and one distinct focus.
Figure 2:
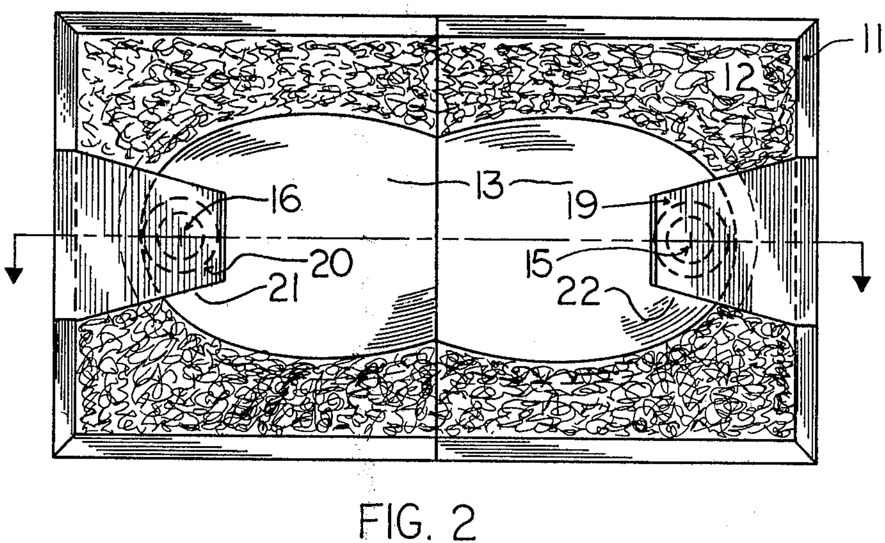
FIG. 2 is a front view thereof.

FIG. 1 and FIG. 2 of the drawings illustrate the top and front views of an enclosure designed to radiate sound originating from transducers placed therein. The enclosure 10 incorporates an external shell 11 that houses an acoustically absorptive material 12 and an interior acoustically reflective shell 13. Suitable materials for the external shell include wood, metal, reinforced resin, or other structural material. Suitable acoustically absorptive material includes foamed plastic, fiberglass, mineral wool, or similar materials. The dimensions of the structure may vary in order to suit the desired end use, but it is to be understood in all cases that for efficient operation the dimensions of the interior acoustically reflective shell are to be larger than the longest wavelength of sound produced by the transducer. The interior acoustically reflective shell may be made of any suitable material such as wood, metal, or the like. The interior acoustically reflective shell is shaped substantially as a section of the envelope of two ellipsoids of revolution having a common focus 14 and two distinct foci 15 and 16. The major axes 17 and 18 of the ellipsoids are the same length and intersect at the common focus to form an angle $\theta$. The angle between the major axes of the ellipsoids is chosen according to the desired ability of the cavity to intensify and radiate sound. Transducers 19 and 20 are mounted so that they are centered about the positions of the distinct foci 15 and 16. They are so fixed in these positions that the sound they produce will be substantially directed toward the acoustically reflective shell 13. The transducers are held in said positions by attaching them to supports 21 and 22. These supports may be made of any structural material such as wood, metal, or the like.

It is to be understood, however, that although the interior acoustically reflective shell shown in FIG. 1 and FIG. 2 is the envelope of two ellipsoids, said envelope could also consist of many ellipsoids so long as they all have one common focus and each has one distinct focus at which point may be placed a transducer. Further, the angle between the major axes of such ellipsoids may be any value desired, and a different section of each ellipsoid may be utilized in constructing the envelope which forms the interior acoustically reflective shell. It is also understood that the length of the major axes and minor axes of said ellipsoids may be any value desired with the restriction that the major axes of all ellipsoids forming the envelope must be the same length for phase matching to occur.

Figure 3:
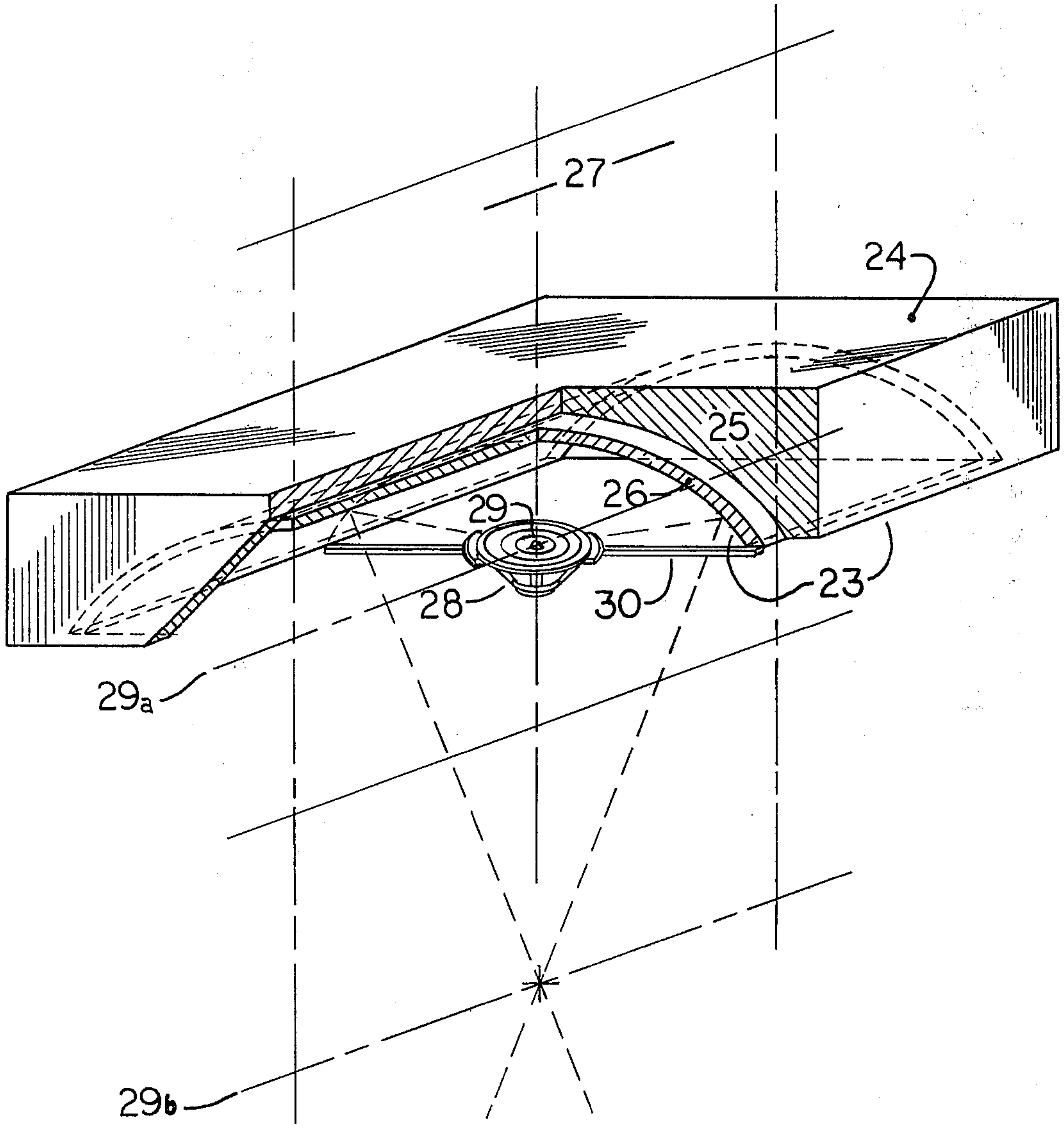
FIG. 3 is an isometric illustration, partly in section, of one embodiment of the invention utilizing as a partial enclosure, a section of a cylinder of elliptical cross section.

FIG. 3 is a drawing which illustrates an enclosure 23 designed to focus and concentrate sound originating from a transducer or set of transducers placed therein. The enclosure consists of an external shell 24 that houses an acoustically absorptive material 25 and an interior acoustically reflective shell 26. Suitable materials for the external shell include wood, reinforced resin, metal, or other structural materials. Suitable material for the acoustically absorptive material include fiberglass, mineral wool, foamed plastic, or similar materials. The acoustically reflective shell may be made of wood, reinforced resin, metal or similar materials. The interior acoustically reflective shell is shaped substantially as a section of a cylinder of elliptical cross section.

Although not necessary to the operation of the invention, the elliptical cross section shown in FIG. 3 is symmetric about the plane 27 which contains the major axes of the set of elliptical cross sections of the cylinder. A transducer 28 is placed at point 29 on the line 29a containing the set of focal points of the elliptical cross sections of the cylinder nearest that section of the cylinder defining the acoustically reflective shell. The transducer is held in such position by cross member 30 and is oriented so that sound produced by it is directed substantially toward the acoustically reflective shell 26. This cross member may be made of any suitable structural material. It is to be understood that the interior acoustically reflective shell could consist of the envelope of many elliptical cross sections, each with a distinct focus, on which is placed a transducer oriented so that the sound produced by it is substantially directed toward the section of the envelope to which the distinct focus belongs, and a common focus to which all sound would be concentrated.

OPERATION

In the operation of enclosure 10, sound emitted from the transducers 19 and 20 is directed substantially toward the interior acoustically reflective shell 13. Transducers 19 and 20 are centered on the distinct foci 15 and 16 of the ellipsoids used to generate the acoustically reflective shell 13 and thus sound reflected from said shell will be concentrated and focused at the common focal point 14 of the acoustically reflective shell 13. Transducer 19 is so oriented that the sound emanating from its strikes and is reflected by only that section of the ellipsoidally shaped acoustically reflective shell 13 to which focal point 16 belongs. Also transducer 20 is so oriented so that sound produced by it strikes and is reflected by only that section of the ellipsoidally shaped acoustically reflective shell 13 to which focal point 15 belongs. Further, the two ellipsoids forming the acoustically reflective shell 13 have substantially the same length of major axis. The above provisions insure that any sound produced by transducer 20 or transducer 19 will travel the same distance in reaching focal point 14 and thus all sound at focal point 14 will be in phase so long as transducers 19 and 20 are electrically coupled to generate sound in phase. Under the above conditions, focal point 14 will appear to be the source of sound rather than the actual transducers themselves. Further, sound emanating from focal point 14 will be in phase and have intensity and phase consistency above that produced by any other combination or arrangement of transducers 19 and 20 not involving an enclosure such as 10. The beamwidth angle $\beta$ of the sound emanating from focal point 14 can be made larger or smaller than the beamwidth angle $\alpha$ of the transducers 19 and 20 by suitable choice of the length of the major axes and minor axes of the ellipsoids which are used to generate the acoustically reflective shell 13, or by the choice of the angle $\theta$ between the ellipsoid's major axes, or by variation of both.

The enclosure 23 illustrated in FIG. 3 operates in a manner similar to that of enclosure 10 except that, owing to the acoustically reflective shell 26 being shaped substantially as a section of a cylinder of elliptical cross section, there will exist a pair of focal lines 29a and 29*b* rather than points for said section. Transducer 28 is placed on focal line 29*a* nearest the enclosure so that the sound produced by the transducer will substantially strike the acoustically reflective shell 26 and upon reflection, be concentrated and focused at focal line 29*b* furthest from the enclosure.

While the above description contains many specificities, these should not be construed as limitations on the scope of the invention, but rather as an exemplification of a number of preferred embodiments thereof. Many other variations are possible, for example the variation of the number of ellipsoids used to generate the envelope of an enclosure such as 10, the angle between their major axes, the orientation of the transducers, the shape of the external shell, its inclusion or omission, the inclusion of acoustically absorptive material or its omission, and the like. Accordingly, the scope of this invention should be determined not by the embodiments illustrated, but by the appended claims and their legal equivalents.

What is claimed is:

1. An enclosure which comprises, in combination, a number of sound transducers coupled so as to produce sound in phase with one another, and an acoustically reflective shell which is shaped substantially as the envelope of at least sections of at least a number of ellipsoids of revolution equal to the number of transducers, all of which have the identical length of major axis, wherein said ellipsoids of revolution are radially oriented with respect to one another so that their respective major axes all intersect at the same point at various angles with respect to one another and such that said point of intersection is coincident with one focal point of each of said ellipsoids, such focal point thereby being common to all said ellipsoids, and with the other focal point of said ellipsoids being distinct from one another and being radially distributed about this common focal point, and wherein said transducers are located so that at least one such transducer is placed at each distinct focal point, said transducer oriented so that the sound produced by it is directed substantially toward that section of the acoustically reflective shell shaped by the section of the ellipsoid of revolution to which said distinct focal point belongs, so that sound produced by each of the transducers is directed to the above specified portion of the acoustically reflective shell, reflected by it and thence directed, focused and concentrated at the aforementioned common focal point, said sound from all the transducers contained within the enclosure arriving at this common focal point with the same phase.

2. An enclosure according to claim 1 wherein all of the transducers are located insofar as is possible at the common focal point of the radially distributed ellipsoids of revolution, with each transducer distinctly oriented so that the sound produced by each is directed substantially and specifically to a different section of the acoustically reflective shell, that section being shaped by a section of the ellipsoid of revolution to which the common focal point and a distinct focal point belong, so that sound produced by a so oriented transducer directed toward said section, will, upon reflection from same, be concentrated and focused at said distinct focal point, so that sound generated by all the transducers so located at the common focal point will be distributed to, and concentrated at each of the distinct focal points.

3. An enclosure which comprises, in combination, a number of sound transducers coupled so as to produce sound in phase or with a fixed phase difference with respect to one another, and an acoustically reflective shell which is shaped substantially as the envelope of at least sections of cylinders of elliptical cross section, all elliptical sections having identical lengths of major axes, wherein said cylinders of elliptical cross section are radially oriented with respect to one another so that their respective major axes all intersect at the same point, but at various angles with respect to one another and such that said intersection is coincident with one focal point of each elliptical cross section, such focal point thereby being common to all ellipses in a given cross section and the set of said common focal points of all the cross sections which constitute the acoustically reflective shell thus comprising a common focal line, and with the other focal points of a cross section being radially distributed about this common focal line, being distinct from one another, but in conjunction with the set of distinct focal points of all cross sections of the acoustically reflective shell, each set thereby forming a distinct focal line, and wherein said transducers are placed along each of the distinct focal lines, said transducers oriented so that sound produced by them is directed substantially toward that section of the acoustically reflective shell shaped by that section of the cylinder of elliptical cross section to which said distinct focal line belongs, so that sound produced by each of the transducers is directed to the above specified portion of the acoustically reflective shell, reflected by it, and thence directed, focused and concentrated at the aforementioned common focal line.

4. An enclosure according to claim 3 wherein all of the transducers are located insofar as is possible at the common focal line of the radially distributed cylinders of elliptical cross section, with a set of transducers distinctly oriented so that the sound produced by the set is directed substantially to a particular section of the acoustically reflective shell, that section being shaped by a section of the cylinder of elliptical cross section to which the common focal line and a distinct focal line belong, so that sound produced by a so oriented transducer set directed toward said section will, upon reflection from same, be concentrated and focused at said distinct focal line, so that sound produced by all the transducer sets so located at the common focal line will be distributed to, and concentrated at each of the distinct focal lines.

5. An enclosure according to claim 3 wherein the acoustically reflective shell is shaped substantially as at least one section of one cylinder of elliptical cross section and a set of transducers are located along one focal line thereof, being oriented so that the sound produced by them substantially strikes said reflective shell and upon reflection is concentrated and focused at the other focal line of said cylinder of elliptical cross section.

6. An enclosure according to claim 3 wherein the acoustically reflective shell is shaped substantially as at least a section of one cylinder of elliptical cross section and a set of transducers are located at one focal line thereof, being so oriented that sound emanating from the rear or back portions of said set of transducers substantially strikes said reflective shell and upon reflection is concentrated and focused at the other focal line of said cylinder of elliptical cross section such that said focused sound is directed substantially in the same direction as sound produced by the front portions of said transducer set.

7. An enclosure according to claim 1 wherein the acoustically reflective shell is shaped substantially as at least a section of two ellipsoids of revolution and transducers are located at the two distinct focal points thereof, being oriented so that sound produced by said transducers substantially strikes said reflective shell and upon reflection is concentrated and focused at the common focal point of said acoustically reflective shell.

* * * * *